(12) United States Patent
Sano

(10) Patent No.: US 6,828,868 B2
(45) Date of Patent: Dec. 7, 2004

(54) SEMICONDUCTOR DEVICE HAVING AN OSCILLATING CIRCUIT

(75) Inventor: Masaru Sano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/254,663

(22) Filed: Sep. 26, 2002

(65) Prior Publication Data

US 2003/0090298 A1 May 15, 2003

(30) Foreign Application Priority Data

Sep. 28, 2001 (JP) ........................................ 2001-303086

(51) Int. Cl.$^7$ .................................................. H03B 5/00
(52) U.S. Cl. .............................. 331/117 R; 331/117 FE; 331/36 C; 331/167; 331/158; 331/116 R
(58) Field of Search ........................ 331/117 R, 117 FE, 331/167, 158, 116 R, 36 C

(56) References Cited

U.S. PATENT DOCUMENTS

| | | | |
|---|---|---|---|
| 6,211,745 B1 | 4/2001 | Mucke et al. | ........... 331/117 R |
| 6,225,871 B1 | 5/2001 | Chien | ................... 331/117 FE |
| 6,255,913 B1 | 7/2001 | Wang | ......................... 331/181 |
| 6,583,675 B2 * | 6/2003 | Gomez | ......................... 331/17 |

FOREIGN PATENT DOCUMENTS

JP  3-29322  4/1991

* cited by examiner

*Primary Examiner*—Arnold Kinkead
(74) *Attorney, Agent, or Firm*—Finnegan, Henderson, Farabow, Garrett & Dunner, L.L.P.

(57) ABSTRACT

In an embodiment consistent with the present invention, a semiconductor device having a oscillating circuit comprises: a first transistor having a control electrode and having one end and the other end of a current path thereof; a second transistor having a control electrode and having one end and the other end of a current path thereof, the control electrode is coupled to one end of the current path of the first transistor and one end of the current path thereof is coupled to the control electrode of the first transistor; a current mirror circuit that supplies a current to one end of the current path of the first transistor and one end of the current path of the second transistor; an inductor coupled to one end of the current path of the first transistor and one end of the current path of the second transistor; a first capacitor coupled to one end of the current path of the first transistor and one end of the current path of the second transistor; and a second capacitor and a switch element coupled with, are coupled one end of the current path of the first transistor and one end of the current path of the second transistor.

40 Claims, 6 Drawing Sheets

SEMICONDUCTOR DEVICE HAVING AN OSCILLATING CIRCUIT

CROSS REFERENCE TO RELATED APPLICATIONS

This application claims the benefit of priority from prior Japanese Patent Application P2001-303086 filed on Sep. 28, 2001; the contents of which are incorporated by reference herein.

BACKGROUND AND MATERIAL INFORMATION

I. Field of the Invention

The present invention relates to a semiconductor device having an oscillating circuit. More particularly, the invention relates to a semiconductor device having a frequency oscillating circuit, such as an LC (which means "inductive-capacitive") oscillating circuit.

II. Background of the Invention

The following will explain an example of the arrangement of a conventional oscillating circuit. FIG. 1 is a circuit diagram illustrating the conventional oscillation circuit arrangement.

In the oscillating circuit of FIG. 1, transistors Q101 and Q102 form a differential pair, and each base of the transistors Q101 and Q102 is connected to a collector of the other transistor. A coil L101 and a capacitor C101, which form an LC resonant tank circuit, are connected between the collectors of these transistors Q101 and Q102.

The collectors of transistors Q101 and Q102 are connected to a power supply voltage $V_{DD}$ via resistors R101 and R102. A constant current source Io is connected to the emitters of transistors Q101 and Q102. Moreover, the constant current source Io is connected to the ground potential GND. The output signal OUT1 from the collector of the transistor Q101 and an output signal OUT2 from the collector of the transistor Q102 are used as a differential pair output, or, alternatively, a single output of one side of the oscillating circuit (e.g., OUT1) is used.

However, the aforementioned oscillating circuit can produce a signal at a fixed frequency, and has a problem in which the frequency cannot be varied.

SUMMARY OF THE INVENTION

Accordingly, the present invention is directed to a semiconductor device having a frequency oscillating circuit, such as an LC oscillating circuit.

A semiconductor device according to an embodiment of the present invention includes, for example, a first transistor having a control electrode and having one end and the other end of a current path thereof; a second transistor having a control electrode and having one end and the other end of a current path thereof, the control electrode is coupled to one end of the current path of the first transistor and one end of the current path thereof is coupled to the control electrode of the first transistor; a current mirror circuit that supplies a current to one end of the current path of the first transistor and one end of the current path of the second transistor; an inductor coupled to one end of the current path of the first transistor and one end of the current path of the second transistor; a first capacitor coupled to one end of the current path of the first transistor and one end of the current path of the second transistor; and a second capacitor and a switch element, are coupled to one end of the current path of the first transistor and one end of the current path of the second transistor.

A semiconductor device according to another embodiment of the present invention includes, for example, a first transistor having a control electrode and having one end and the other end of a current path thereof; a second transistor in which a control electrode is coupled to one end of the current path of the first transistor and one end of a current path thereof is coupled to the control electrode of the first transistor; a current mirror circuit that supplies a current to one end of the current path of the first transistor and one end of the current path of the second transistor; an inductor coupled to one end of the current path of the first transistor and one end of the current path of the second transistor; a constant current source coupled to the other end of the current path of the first transistor and the other end of the current path of the second transistor; a first capacitor coupled to one end of the current path of the first transistor and the other end of the constant current source; a second capacitor coupled to one end of the current path of the second transistor and the other end of the constant current source; a third capacitor and a first switch element coupled to one end of the current path of the second transistor and the other end of the constant current source; and a fourth capacitor and a second switch element coupled to one end of the current path of the second transistor and the other end of the constant current source.

Other features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are incorporated in and constitute a part of this specification, illustrate several embodiments and together with the description, serve to explain the principles of the invention. A more complete appreciation of the present invention and many of its attendant advantages will be readily obtained by reference to the following detailed description considered in connection with the accompanying drawings, in which.

DETAILED DESCRIPTION OF THE EMBODIMENTS

The following will explain the embodiments of the present invention with reference to the accompanying drawings. In the description given below, wherever possible, the same reference numbers will be used throughout the drawings to refer to the same or like parts.

Figure 2:
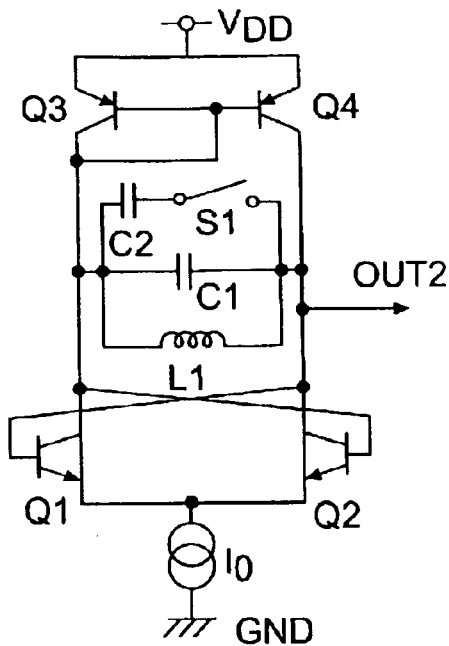
FIG. 2 is a circuit diagram illustrating the arrangement of an oscillating circuit according to the first embodiment.

First, the oscillating circuit of the first embodiment of this invention will be explained. FIG. 2 is a circuit diagram illustrating the arrangement of an oscillating circuit according to the first embodiment of this invention.

As illustrated in FIG. 2, npn transistors Q1 and Q2 form a differential pair, and each base of the transistors Q1 and Q2 is connected to a collector of the other transistor, i.e., the base of transistor Q1 is connected to the collector of Q2 while the base of transistor Q2 is connected to the collector of Q1.

A collector and a base of a pnp transistor Q3 are connected to the collector of the transistor Q1. A collector of a pnp transistor Q4 is connected to a collector of the transistor Q2. The arrangement of Q3 and Q4 is referred to herein as a current mirror which serves as a current source (or path).

A coil L1 and a capacitor C1, which form an LC resonant tank, are connected in parallel between the collectors of the transistors Q1 and Q2. Moreover, a capacitor C2 and a switch S1 are connected in series between the collectors of the transistors Q1 and Q2.

A constant current source Io is connected to the emitters of transistors Q1 and Q2. Moreover, the constant current source Io is connected to a reference potential terminal (for example, the ground potential GND). The emitters of the transistors Q3 and Q4 are connected to a power supply voltage VDD, respectively. Then, an output signal OUT is outputted from the collector of the transistor Q2.

In the above-arranged oscillating circuit, the capacitance value of the LC resonant tank is changed by turning ON/OFF the switch S1. The change of the capacitance value of the resonant tank variably changes an oscillation frequency of the output signal OUT.

Namely, the oscillating circuit shown in FIG. 2 has a differential amplifying circuit, which is composed of the npn transistors Q1, Q2 and the pnp transistors Q3, Q4, which are active loads; the coil L1 and the capacitor C1, which are connected in parallel between the collector of the transistor Q1 and the collector of the transistor Q2; and the capacitor C2 and the switch S1, which are connected in series between the collector of the transistor Q1 and the collector of the transistor Q2. Moreover, the constant current source Io is connected to the emitters of the transistors Q1 and Q2, and the power supply voltage $V_{DD}$ is connected to the emitters of the transistors Q3 and Q4.

According to the above-explained oscillating circuit, a constant of the LC resonant tank is decided depending on whether or not the coil L1, the capacitor C1, and the capacitor C2 are incorporated into the circuit. In other words, by turning the switch S1 ON or OFF, the time constant of the LC resonant tank is switched to "L1+C1" or "L1+C1+C2." This makes it possible to readily change the oscillation frequency of the output signal OUT.

Figure 1:
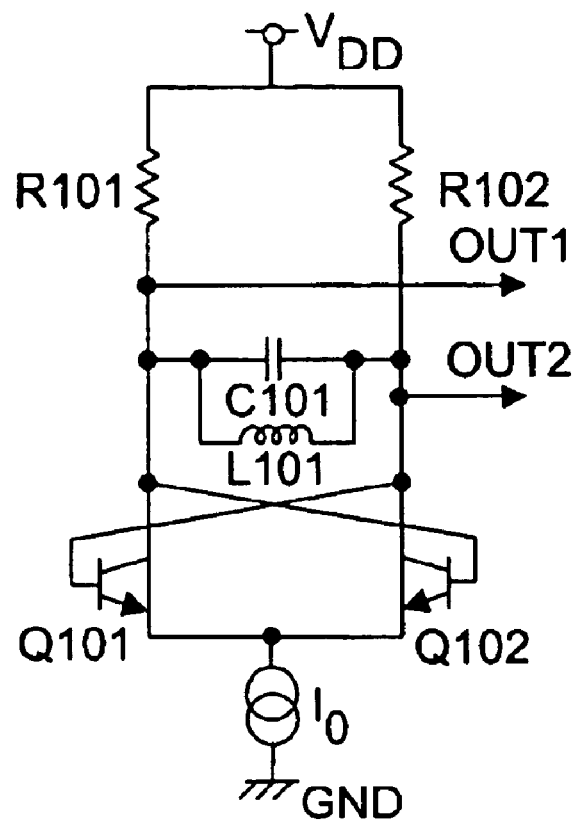
FIG. 1 is a circuit diagram illustrating the arrangement of a conventional oscillating circuit.

Moreover, the oscillating circuit depicted in FIG. 2 uses the transistors Q3 and Q4, which are active loads, in place of resistance loads R101 and R102 connected to the collectors of transistors Q101 and Q102 of the oscillating circuit of FIG. 1. Accordingly, the oscillating circuit depicted in FIG. 2 makes it possible to increase the gain of differential amplifying circuit and to facilitate oscillation in the oscillating circuit.

Figure 3:
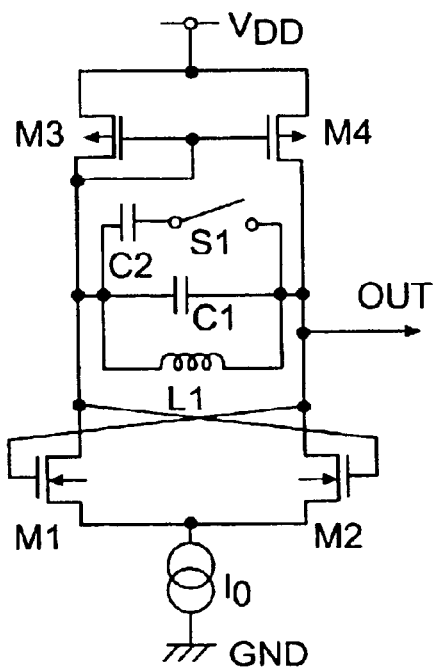
FIG. 3 is a circuit diagram illustrating the arrangement of an oscillating circuit of one modification of the first embodiment.

Furthermore, as illustrated in FIG. 3, the oscillating circuit of FIG. 1 may be formed using MOS transistors in place of bipolar transistors. The oscillating circuit of FIG. 2 is one in which the npn transistors Q1 and Q2 and the pnp transistors Q3 and Q4 of the oscillating circuit shown in FIG. 1 are replaced with n-channel MOS transistors M1 and M2 and p-channel MOS transistors M3 and M4, respectively. Otherwise, the arrangement and operation of FIG. 3 are similar to the oscillating circuit of the first embodiment shown in FIG. 2.

Figure 4A:
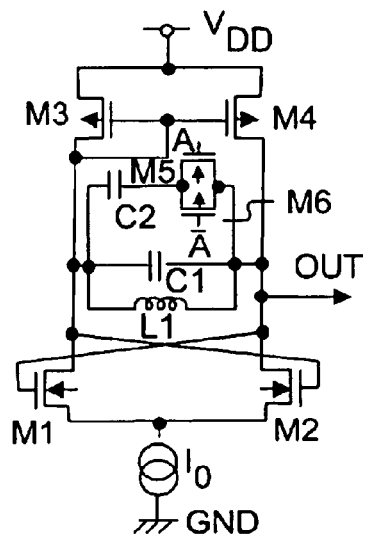
FIG. 4A is a circuit diagram illustrating the arrangement of an oscillating circuit of another modification of the first embodiment.

In the oscillating circuit of FIG. 3, a switch S1 may be formed using a transfer gate as illustrated in FIG. 4A. This transfer gate is composed of an n-channel MOS transistor M5 and a p-channel MOS transistor M6. In particular, a signal (labeled A) is input to the gate of the n-channel MOS transistor M5, and a signal (labeled $\overline{A}$), which is a negative phase of the signal A, is input to the p-channel MOS transistor M6.

According to the oscillating circuit having the arrangement shown in FIG. 4A, when the signal A is set to be "L" in level (e.g., low level) and the signal $\overline{A}$ is set to be "H" in level (e.g., high in level), the transfer gate is interrupted (or opened). Resultantly, the constant of the LC resonant tank is set to "L1+C1." When the signal A is set to be "H" in level and the signal $\overline{A}$ is set to be "L" in level, the transfer gate is conductive. Resultantly, the constant of the LC resonant tank is set to "L1+C1+C2." In this way, the constant of the LC resonant tank is switched to "L1+C1 " or "L1+C1+C2", making it possible to easily change the oscillation frequency of the output signal OUT in this oscillation circuit.

Figure 4B:
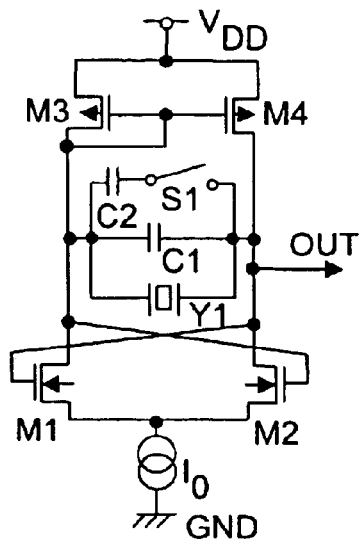
FIG. 4B is a circuit diagram illustrating the arrangement of an oscillating circuit of another modification of the first embodiment.

The coil L1 may be replaced with other inductors such as a quartz oscillator, as illustrated in FIG. 4B in which L1 is replaced with Y1. Moreover, ceramic capacitors may be used as the capacitors C1 and C2, and other capacitor, for example, a MOS capacitor may be used instead. Still moreover, the oscillating circuit of the first embodiment may be formed in the integrated circuit on the semiconductor substrate to make it possible to obtain oscillation at a more stable frequency.

As explained above, according to the first embodiment of the present invention, it is possible to provide an oscillating circuit that can vary the oscillation frequency according to the control signal that controls the ON/OFF of switch S1.

Figure 5:
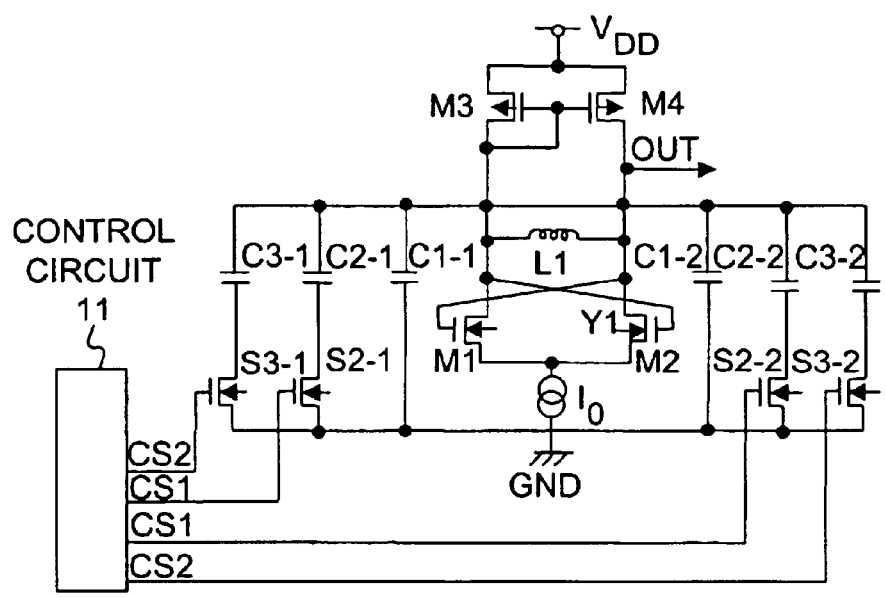
FIG. 5 is a circuit diagram illustrating the arrangement of an oscillating circuit according to the second embodiment.

FIG. 5 is a circuit diagram illustrating the arrangement of an oscillating circuit according to the second embodiment of this invention. The same portions as those of the arrangement of the first embodiment of FIG. 3 are denoted by the same reference numerals and the explanation is omitted, and the following explains the different portions.

As illustrated in FIG. 5, a capacitor C1-1 is connected between a drain of a MOS transistor M1 and the ground potential GND. A capacitor C1-2 is connected between a drain of the MOS transistor M2 and the ground potential GND. Similarly, a capacitor C2-1 and a MOS transistor S2-1 are connected in series between the drain of the MOS transistor M1 and the ground potential GND. A capacitor C2-2 and a MOS transistor S2-2 are connected in series between the drain of the MOS transistor M2 and the ground potential GND. Moreover, a capacitor C3-1 and a MOS transistor S3-1 are connected in series between the drain of the MOS transistor M1 and the ground potential GND. A capacitor C3-2 and a MOS transistor S3-2 are connected in series between the drain of the MOS transistor M2 and the ground potential GND.

In one embodiment, the capacitance of the capacitor C1-1 is equal to that of the capacitor C1-2. Similarly, the capacitance of the capacitor C2-1 is equal to that of the capacitor C2-2, and the capacitance of the capacitor C3-1 is equal to that of the capacitor C3-2-although any other combination of capacitance values may be used instead.

Namely, the capacitor C1-1, the capacitor C2-1 and the MOS transistor S2-1, which are connected to each other in series, and the capacitor C3-1 and the MOS transistor S3-1, which are connected to each other in series, are connected in parallel between the drain of the MOS transistor M1 and the ground potential GND. Moreover, the capacitor C1-2, the capacitor C2-2 and the MOS transistor S2-2, which are connected to each other in series, and the capacitor C3-2 and the MOS transistor S3-2, which are connected to each other in series, are connected in parallel between the drain of the MOS transistor M2 and the ground potential GND. In this way, in the oscillating circuit shown in FIG. 5, the capacitor and the coil are not connected to each other in parallel, but they are connected between each of both ends of the coil and the ground potential GND. Even if such a connection (as depicted in FIG. 5) is made, the effect is similar as in the case shown in FIG. 4A where the capacitor and the coil are connected in parallel.

Moreover, a control signal generating circuit 11 is connected to the gates of the MOS transistors S2-1, S2-2, S3-1 and S3-2. The control signal generating circuit 11 generates control signals CS1 and CS2 that turn ON/OFF the MOS transistors S2-1, S2-2, S3-1, and S3-2. The control signal CS1 is input to the gates of the MOS transistors S2-1 and S2-2, and the control signal CS2 is input to the gates of the MOS transistors S3-1 and S3-2. When the control signals CS1 and CS2 are "L" in level, all the MOS transistors S2-1, S2-2, S3-1, and S3-2 are turned OFF, and these MOS transistors are in a state where they are tuned off. At this time, the capacitance relating to oscillation becomes ½C, where C is equal to C1-1 (which is also equal to C1-2). Accordingly, the oscillating circuit outputs an output signal OUT having an oscillation frequency that is based on the coil L1 and the capacitance ½C.

When the control signal CS1 is "H" in level and the control signal CS2 is "L" in level, the MOS transistors S2-1 and S2-2 are turned ON, and MOS transistors S3-1 and S3-2 are turned OFF. Resultantly, the MOS transistors S2-1 and S2-2 are in a state where they are tuned on, and the MOS transistors S3-1 and S3-2 are in a state where they are tuned off. At that time, the capacity relating to oscillation becomes "(C1+C2)/2." Accordingly, the oscillating circuit outputs the output signal OUT having an oscillation frequency that based on the coil L1 and the capacitance "(C1+C2)/2".

When the control signals CS1 and CS2 are "H" in level, all of the MOS transistors S2-1, S2-2, S3-1, and S3-2 are turned ON, and these MOS transistors fall in a turning on state. At this time, the capacity relating to oscillation becomes "(C1+C2+C3)/2." Accordingly, the oscillating circuit outputs the output signal OUT having an oscillation frequency that is based on the coil L1 and the capacitance "(C1+C2+C3)/2".

An explanation will be next given of the specific circuit arrangement of the control signal generating circuit 11.

Figure 6:
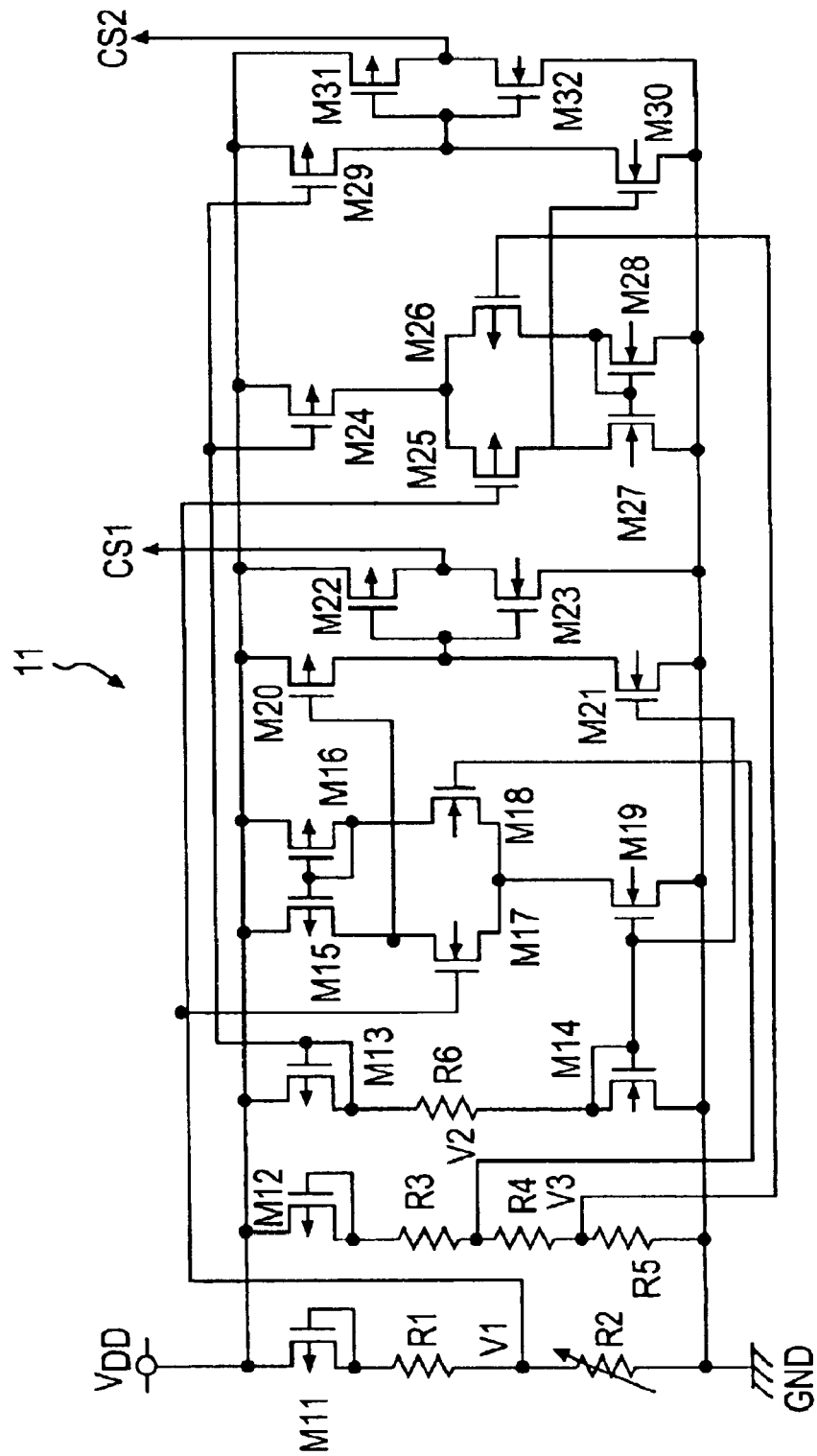
FIG. 6 is a circuit diagram illustrating the arrangement of a control signal generating circuit in the oscillating circuit according to the second embodiment.

FIG. 6 is a circuit diagram illustrating the arrangement of a control signal generating circuit. As illustrated in FIG. 6, a control signal generating circuit 11 comprises a circuit that generates a variable voltage V1, a circuit that generates reference voltages V2 and V3, a comparator that compares the variable voltage V1 with the reference voltage V2, and a comparator that compares the variable voltage V1 with the reference voltage V3.

The circuit that generates the variable voltage V1 is composed of a MOS transistor M11 connected between a power supply voltage $V_{DD}$ and the ground potential GND, a resistor R1, and a variable resistor R2. The circuit that generates the reference voltages V2 and V3 is composed of a MOS transistor M12 connected between the power supply voltage $V_{DD}$ and the ground potential GND, a resistor R3, a resistor R4, and a resistor R5.

The comparator, which compares the variable voltage V1 with the reference voltage V2, is composed of MOS transistors M15 to M18. The comparator, which compares the variable voltage V1 with the reference voltage V3, is composed of MOS transistors M25 to M28.

Moreover, the control signal generating circuit 11 has MOS transistors M13, M14, M19 to M24, M29 to M32, and a resistor R6 connected thereto as illustrated in FIG. 6.

In the control signal generating circuit 11, control signals CS1 and CS2 are generated by the following operations. First, when the resistance value of the variable resistor R2 is set, the variable voltage V1 is decided by the MOS transistor 11, which is connected between the power supply voltage $V_{DD}$ and the ground potential GND, the resistor R1, and the resistor R2 according to the set resistance value of the resistor R2. Moreover, the reference voltages V2 and V3 are generated by the MOS transistor M12, which is connected between the power supply voltage $V_{DD}$ and the ground potential GND, and the resistors R3 to R5.

The variable voltage V1 and the reference voltage V2 are input to the MOS transistors M17 and M18 that form the comparator. Then, the variable voltage V1 and the reference voltage V2 are compared by this comparator, and the control signal CS1 is output by an inverter composed of MOS transistors M22 and M23 based on the comparison result.

Moreover, the variable voltage V1 and the reference voltage V3 are input to the MOS transistors M25 and M26 that form the comparator. Then, the variable voltage V1 and the reference voltage V3 are compared by this comparator, and the control signal CS2 is output from an inverter composed of the MOS transistors M31 and M32 based on the comparison result.

As described above, the control signals CS1, CS2 are used with three patterns in many cases: (CS1, CS2)=(L, L), (H, L), (H, H). In order to generate such patterns, the following relationship among the variable voltage V1 and the reference voltages V2 and V3 must be established based on the following conditions:

When (CS1, CS2)=(L, L), V2<V1, and V3<V1     (1)

When (CS1, CS2)=(H, L), V3<V1<V2     (2)

When (CS1, CS2)=(H, H), V1<V2, and V1<V3     (3)

In order to satisfy the above three conditions, the following relationships among the resistors R1 to R5 must be established. In order to satisfy condition (1), the relationships expressed by (R4+R5)/(R3+R4+R5)<R2/(R1+R2) and by R5/(R3+R4+R5)<R2/(R1+R2) are needed. In order to satisfy condition (2), the relationship expressed by R5/(R3+

R4+R5)<R2/(R1+R2)<(R4+R5)/(R3+R4+R5) is needed. Moreover, in order to satisfy condition (3), the relationships expressed by R2/(R1+R2)<(R4+R5)/(R3+R4+R5) and by R2/(R1+R2)<R5/(R3+R4+R5) are needed.

Figure 7:
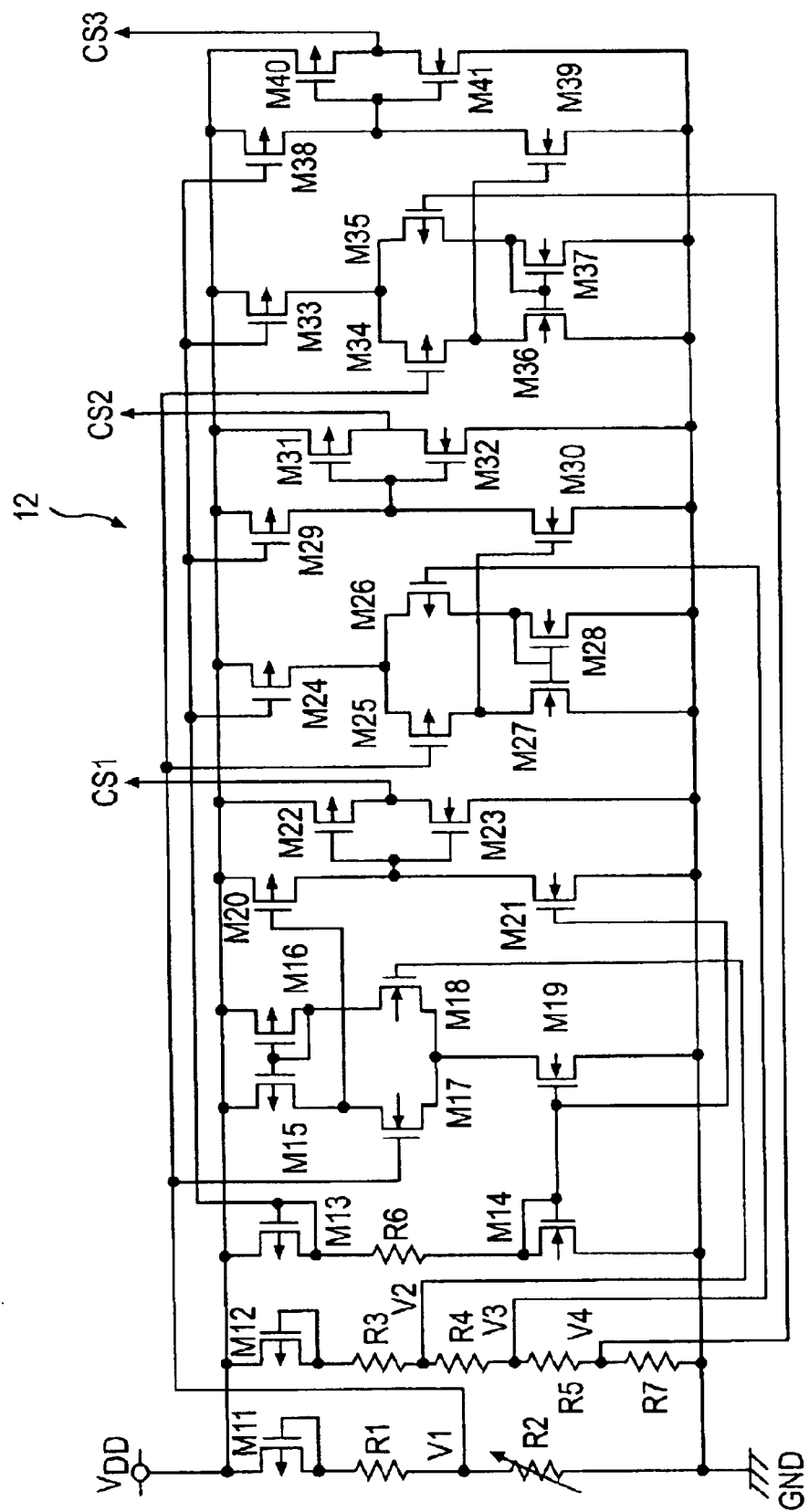
FIG. 7 is a circuit diagram illustrating another arrangement of the control signal generating circuit in the oscillating circuit according to the second embodiment.

Moreover, although the control signal generating circuit 11 shown in FIG. 6 is a circuit that generates the two control signals CS1 and CS2, the circuit of FIG. 6 may be expanded as illustrated in FIG. 7, so that a control signal generating circuit 12 that generates three control signals CS1, CS2, and CS3 can be formed.

The control signal generating circuit 12 includes an additional resistor R7 that is added to generate a reference voltage V4. Furthermore, a comparator, which is composed of MOS transistors M34 to M37 and which compares the variable voltage V1 with the reference voltage V4, is added. Moreover, as shown in FIG. 7, MOS transistor M33 and M38 to M41 are added.

The circuit arrangement of FIG. 7 may be further modified by adding additional components, which makes it possible to generate more than three control signals. In addition, the control signal generating circuit 12 may be used as the control signal generating circuit of FIG. 5.

The use of the control signal generating circuit that generates numerous control signals makes it possible to add the number of pairs of capacitor and transistor connected in series to the oscillating circuit shown in FIG. 5 according to the number of control signals. This makes it possible to set the capacitance relating to resonance to more than three kinds of oscillation frequencies. Namely, the oscillating circuit of FIG. 7 with its three control signals CS1, CS2, CS3 can vary the capacity relating to resonance by three kinds and produce the output signal OUT having three kinds of oscillation frequencies. However, if the capacitance relating to resonance can be set to more than three kinds, the oscillating circuit can produce the output signal OUT having more than three kinds of oscillation frequencies.

Similar to the first embodiment, the coil L1 may be replaced with other inductors such as a quartz oscillator. Moreover, ceramic capacitors may be used as the capacitors C1-1, C1-2, C2-1, C2-2, C3-1 and C3-2, and other capacitors, for example, a MOS capacitor may be used.

Still moreover, the oscillating circuit of the second embodiment is formed in the integrated circuit on the semiconductor substrate to make it possible to obtain oscillation at more stable frequency. Among the circuit elements that form the control signal generating circuits 11 and 12, it is preferable that a variable resistor R2 is placed at the outer portion of the integrated circuit and other circuit elements (except the variable resistor R2) are placed in the integrated circuit. In this way, placement of variable resistor R2 at the outer portion of the integrated circuit provides a means of readily changing the resistance value of the variable resistor R2.

As explained above, according to the second embodiment of the present invention, it is possible to provide an oscillating circuit that can vary the oscillation frequency by changing the resistance value of the resistor R2 in the control signal generating circuit.

Figure 8:
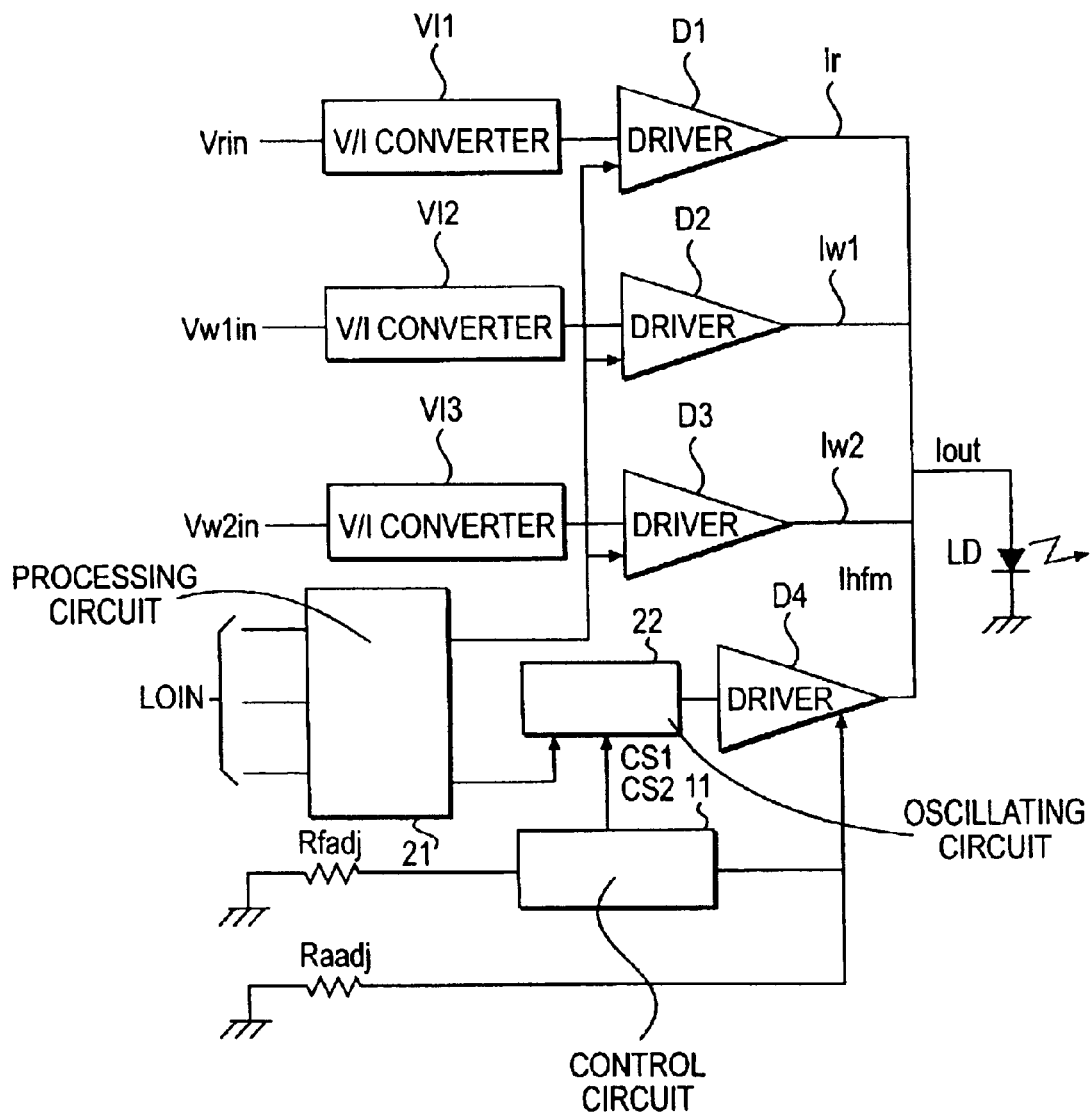
FIG. 8 is a circuit diagram illustrating the arrangement of a semiconductor laser driving circuit having an oscillating circuit.

FIG. 8 is a circuit diagram illustrating the arrangement of the semiconductor laser driving circuit having the oscillating circuit. Either of the oscillating circuits of the first and the second embodiments may be used in a semiconductor laser driving circuit. This semiconductor laser driving circuit is formed on a semiconductor substrate. Here, it is assumed that the semiconductor laser is used at the time of reading and writing in, for example, a compact disc device (CD-R/RW).

As illustrated in FIG. 8, a voltage Vrin for setting a read current Ir is converted into a current by a voltage-current converting circuit (V/I converting circuit), and the resultant is input to a current output circuit (Driver) D1. There are two kinds of write currents. A voltage Vw1in for setting a first write current Iw1 is converted to a current by a voltage-current converting circuit V12, and the resultant is input to a current output circuit D2. A voltage Vw2in for setting a second write current Iw2 is converted to a current by a voltage-current converting circuit V13, and the resultant is input to a current output circuit D3. The read current Ir is a current that is used at a reading time, and write currents Iw1 and Iw2 are currents that are used at a writing time.

A logic input signal LOIN is input to a logic processing circuit 21. The logic processing circuit 21 outputs a signal, which controls the presence or the absence of the operation of an oscillating circuit 22, to the oscillating circuit 22 according to the input logic input signal LOIN. Also, the logic processing circuit 21 outputs a signal, which controls whether or not the read current Ir, the write current Iw1, the write current Iw2 are to be output, to the current output circuits D1, D2, and D3.

Moreover, a ground potential is supplied to a control signal generating circuit 11 via a resistor Rfadj, and the control signal generating circuit 11 outputs control signals CS1 and CS2, which are used to control an oscillation frequency fixed by the resistor Rfadj, to the oscillating circuit 22. The oscillating circuit 22 outputs a signal with an oscillation frequency, which is responsive to the control signals CS1 and CS2, to a current output circuit D4.

The ground potential is supplied to the current output circuit D4 via a resistor Raadj. The resistor Raadj decides amplitude of the current that the current output circuit D4 outputs. Accordingly, the current output circuit D4 outputs a current Ihfm with amplitude, which is fixed by an oscillation frequency output from the oscillation circuit 22 and the resistor Raadj.

At the time of reading, a current Iout, which is generated by the read current Ir and the current Ihfm, is supplied to a laser diode LD. Moreover, at the time of writing, the write current Iw1 is changed to the current Iout, and is supplied to the laser diode LD. Or, the current Iout, which is generated by the write current Iw1 and the write current Iw2, is supplied to the laser diode LD. Then, the laser diode LD varies intensity of light-emission according to the oscillation frequency of the current Iout and amplitude.

In the aforementioned semiconductor laser driving circuit, the oscillation frequency output from the oscillating circuit 22 can be varied by the control signals CS1 and CS2 output from the control signal generating circuit 11. This makes it possible to change the oscillation frequency of the current Iout to be supplied to the laser diode LD and to vary the state of light-emission of the laser diode LD.

Moreover, the aforementioned embodiments include a plurality of structural elements that may be appropriately combined in various combinations.

As mentioned above, according to the present invention, there can be provided an oscillating circuit, which is capable of varying the oscillation frequency according to the control signal, and the semiconductor device having such an oscillating circuit.

What is claimed is:

1. A semiconductor device comprising:
   a first transistor having a control electrode and having one end and the other end of a current path thereof;
   a second transistor having a control electrode and having one end and the other end of a current path thereof, the control electrode of the second transistor is coupled to one end of the current path of the first transistor and one end of the current path of the second transistor is coupled to the control electrode of the first transistor;

a constant current source coupled to the other end of the current path of the first transistor and the other end of the current path of the second transistor;

a current mirror circuit that supplies a current to one end of the current path of the first transistor and one end of the current path of the second transistor;

an inductor coupled to one end of the current path of the first transistor and one end of the current path of the second transistor;

a first capacitor coupled to one end of the current path of the first transistor and one end of the current path of the second transistor; and a second capacitor and a switch element coupled to one end of the current path of the first transistor and one end of the current path of the second transistor.

2. A semiconductor device comprising:

a first transistor having a control electrode and having one end and the other end of a current path thereof;

a second transistor having a control electrode and having one end and the other end of a current path thereof, the control electrode of the second transistor is coupled to one end of the current path of the first transistor and one end of the current path of the second transistor is coupled to the control electrode of the first transistor;

a current mirror circuit that supplies a current to one end of the current path of the first transistor and one end of the current path of the second transistor, wherein the current mirror circuit comprises a third transistor having one end a current path thereof connected to one end of the current path of the first transistor and a fourth transistor having one end of a current path thereof connected to one end of the current path of the second transistor, and control electrodes of the third and fourth transistors are coupled to one end of the current path of the first transistor;

an inductor coupled to one end of the current path of the first transistor and one end of the current path of the second transistor;

a first capacitor coupled to one end of the current path of the first transistor and one end of the current path of the second transistor; and a second capacitor and a switch element coupled to one end of the current path of the first transistor and one end of the current path of the second transistor.

3. A semiconductor device comprising:

a first transistor having a control electrode and having one end and the other end of a current path thereof;

a second transistor having a control electrode and having one end and the other end of a current path thereof, the control electrode of the second transistor is coupled to one end of the current path of the first transistor and one end of the current path of the second transistor is coupled to the control electrode of the first transistor;

a current mirror circuit that supplies a current to one end of the current path of the first transistor and one end of the current path of the second transistor;

an inductor coupled to one end of the current path of the first transistor and one end of the current path of the second transistor;

a first capacitor coupled to one end of the current path of the first transistor and one end of the current path of the second transistor; and a second capacitor and a switch element coupled to one end of the current path of the first transistor and one end of the current path of the second transistor, wherein the switch element is a transfer gate.

4. The semiconductor device according to claim 3, wherein the transfer gate comprises an n-channel MOS transistor and a p-channel MOS transistor in which both of one ends of current paths thereof are coupled to each other and both of the other ends of the current paths thereof are connected to each other.

5. The semiconductor device according to claim 1, wherein the inductor is a coil.

6. A semiconductor device comprising:

a first transistor having a control electrode and having one end and the other end of a current path thereof;

a second transistor having a control electrode and having one end and the other end of a current path thereof, the control electrode of the second transistor is coupled to one end of the current path of the first transistor and one end of the current path of the second transistor is coupled to the control electrode of the first transistor;

a current mirror circuit that supplies a current to one end of the current path of the first transistor and one end of the current path of the second transistor;

a quartz resonator coupled to one end of the current path of the first transistor and one end of the current path of the second transistor;

a first capacitor coupled to one end of the current path of the first transistor and one end of the current path of the second transistor; and a second capacitor and a switch element coupled to one end of the current path of the first transistor and one end of the current path of the second transistor.

7. A laser driving circuit comprising:

a first transistor having a control electrode and having one end and the other end of a current path thereof;

a second transistor having a control electrode and having one end and the other end of a current path thereof, the control electrode of the second transistor is coupled to one end of the current path of the first transistor and one end of the current path of the second transistor is coupled to the control electrode of the first transistor;

a current mirror circuit that supplies a current to one end of the current path of the first transistor and one end of the current path of the second transistor;

an inductor coupled to one end of the current path of the first transistor and one end of the current path of the second transistor;

a first capacitor coupled to one end of the current path of the first transistor and one end of the current path of the second transistor; and a second capacitor and a switch element coupled to one end of the current path of the first transistor and one end of the current path of the second transistor.

8. A semiconductor circuit comprising:

a first transistor having a control electrode and having one end and the other end of a current path thereof;

a second transistor in which a control electrode is coupled to one end of the current path of the first transistor and one end of a current path thereof is coupled to the control electrode of the first transistor;

a current mirror circuit that supplies a current to one end of the current path of the first transistor and one end of the current path of the second transistor;

an inductor coupled to one end of the current path of the first transistor and one end of the current path of the second transistor;

a constant current source coupled to the other end of the current path of the first transistor and the other end of the current path of the second transistor;

a first capacitor coupled to one end of the current path of the first transistor and the other end of the constant current source;

a second capacitor coupled to one end of the current path of the second transistor and the other end of the constant current source;

a third capacitor and a first switch element coupled to one end of the current path of the second transistor and the other end of the constant current source; and a fourth capacitor and a second switch element coupled to one end of the current path of the second transistor and the other end of the constant current source.

9. The semiconductor device according to claim 8, wherein the current mirror circuit comprises a third transistor having one end a current path thereof connected to one end of the current path of the first transistor and a fourth transistor having one end of a current path thereof connected to one end of the current path of the second transistor, and control electrodes of the third and fourth transistors are coupled to one end of the current path of the first transistor.

10. The semiconductor device according to claim 8, wherein the switch element is a transfer gate.

11. The semiconductor device according to claim 10, wherein the transfer gate is constituted an n-channel MOS transistor and a p-channel MOS transistor in which both of one ends of current paths thereof are coupled to each other and both of the other ends of the current paths thereof are connected to each other.

12. The semiconductor device according to claim 8, wherein the inductor is a coil.

13. The semiconductor device according to claim 8, wherein the inductor is a quartz resonator.

14. The semiconductor device according to claim 8, wherein the semiconductor device is laser driving circuit.

15. A semiconductor circuit comprising:

a first transistor having a control electrode and having one end and the other end of a current path thereof;

a second transistor in which a control electrode is connected to one end of the current path of the first transistor and one end of a current path is connected to the control electrode of the first transistor;

a current mirror circuit that supplies a current to one end of the current path of the first transistor and one end of the current path of the second transistor;

an inductor coupled to one end of the current path of the first transistor and one end of the current path of the second transistor;

a constant current source coupled to the other end of the current path of the first transistor and the other end of the current path of the second transistor;

a first capacitor coupled to one end of the current path of the first transistor and the other end of the constant current source;

a second capacitor coupled to one end of the current path of the second transistor and the other end of the constant current source;

a third capacitor and a first switch element coupled to one end of the current path of the first transistor and the other end of the constant current source;

a fourth capacitor and a second switch element coupled to one end of the current path of the second transistor and the other end of the constant current source; and a control circuit rendering the first switch element and the second switch element to be a turning-on state or a turning-off state.

16. The semiconductor device according to claim 15, wherein the semiconductor device is laser driving circuit.

17. A semiconductor device with a frequency of operation comprising:

a first transistor having a first control electrode and coupled to a first current path;

a second transistor having a second control electrode and coupled to a second current path, such that the first control electrode is coupled to the second current path, and the second control electrode is coupled to the first current path;

a current mirror circuit for supplying current to the first and second current path;

an inductor coupled to the first and second current paths;

a first capacitor coupled to the first current path;

a first switch element for coupling a second capacitor to the first current path, such that the second capacitor varies the frequency of operation of the semiconductor device;

a second switch element for coupling a third capacitor to the first current path, such that the third capacitor varies the frequency of operation of the semiconductor device; and a controller for switching the first and second switch based on first and second control signals, wherein said controller further comprises a variable resistor for varying the frequency of operation of the semiconductor device.

18. The semiconductor device of claim 17 further comprising a controller for switching the first switch based on a control signal.

19. The semiconductor device of claim 17, wherein the variable resistor is external to the semiconductor device.

20. The semiconductor claim 17, wherein the current mirror is further coupled to a voltage source.

21. The semiconductor of claim 17, wherein the first capacitor is further coupled to the second current path.

22. A semiconductor device with a frequency of operation comprising:

a first transistor having a first control electrode and coupled to a first current path;

a second transistor having a second control electrode and coupled to a second current path, such that the first control electrode is coupled to the second current path, and the second control electrode is coupled to the first current path;

a constant current source coupled to the first and second current paths;

a current mirror circuit for supplying current to the first and second current path;

an inductor coupled to the first and second current paths;

a first capacitor coupled to the first current path; and a first switch element for coupling a second capacitor to the first current path, such that the second capacitor varies the frequency of operation of the semiconductor device.

23. A semiconductor device with a frequency of operation comprising:

a first transistor having a first control electrode and coupled to a first current path;

a second transistor having a second control electrode and coupled to a second current path, such that the first control electrode is coupled to the second current path, and the second control electrode is coupled to the first current path;

a current mirror circuit for supplying current to the first and second current path, wherein the current mirror circuit further comprises a third transistor coupled to the first current path and a voltage source; and a fourth transistor coupled to the second current path and the voltage source, wherein control electrodes of the third and fourth transistors are coupled to the first current path;

an inductor coupled to the first and second current paths;

a first capacitor coupled to the first current path; and a first switch element for coupling a second capacitor to the first current path, such that the second capacitor varies the frequency of operation of the semiconductor device.

24. A semiconductor device with a frequency of operation comprising:

a first transistor having a first control electrode and coupled to a first current path;

a second transistor having a second control electrode and coupled to a second current path, such that the first control electrode is coupled to the second current path, and the second control electrode is coupled to the first current path;

a current mirror circuit for supplying current to the first and second current path;

an inductor coupled to the first and second current paths;

a first capacitor coupled to the first current path; and a transfer gate for coupling a second capacitor to the first current path, such that the second capacitor varies the frequency of operation of the semiconductor device.

25. The semiconductor device of claim 24, wherein the transfer gate further comprises an n-channel MOS (metal oxide silicon) transistor and a p-channel MOS transistor, wherein the transfer gate is controlled by one or more control signals.

26. The semiconductor device of claim 25, wherein the inductor is a coil.

27. A semiconductor device with a frequency of operation comprising:

a first transistor having a first control electrode and coupled to a first current path;

a second transistor having a second control electrode and coupled to a second current path, such that the first control electrode is coupled to the second current path, and the second control electrode is coupled to the first current path;

a current mirror circuit for supplying current to the first and second current path;

a quartz resonator coupled to the first and second current paths;

a first capacitor coupled to the first current path; and a first switch element for coupling a second capacitor to the first current path, such that the second capacitor varies the frequency of operation of the semiconductor device.

28. A semiconductor device for driving a laser and with a frequency of operation comprising:

a first transistor having a first control electrode and coupled to a first current path;

a second transistor having a second control electrode and coupled to a second current path, such that the first control electrode is coupled to the second current path, and the second control electrode is coupled to the first current path;

a current mirror circuit for supplying current to the first and second current path;

an inductor coupled to the first and second current paths;

a first capacitor coupled to the first current path; and a first switch element for coupling a second capacitor to the first current path, such that the second capacitor varies the frequency of operation of the semiconductor device.

29. The semiconductor device according to claim 2, wherein the inductor is a coil.

30. The semiconductor device according to claim 3, wherein the inductor is a coil.

31. The semiconductor device according to claim 7, wherein the inductor is a coil.

32. The semiconductor of claim 22, wherein the current mirror is further coupled to a voltage source.

33. The semiconductor of claim 22, wherein the first capacitor is further coupled to the second current path.

34. The semiconductor of claim 23, wherein the first capacitor is further coupled to the second current path.

35. The semiconductor of claim 24, wherein the current mirror is further coupled to a voltage source.

36. The semiconductor of claim 24, wherein the first capacitor is further coupled to the second current path.

37. The semiconductor of claim 27, wherein the current mirror is further coupled to a voltage source.

38. The semiconductor of claim 27, wherein the first capacitor is further coupled to the second current path.

39. The semiconductor of claim 28, wherein the current mirror is further coupled to a voltage source.

40. The semiconductor of claim 28, wherein the first capacitor is further coupled to the second current path.

* * * * *